United States Patent
Taniguchi et al.

(10) Patent No.: US 7,622,926 B2
(45) Date of Patent: Nov. 24, 2009

(54) MAGNETIC RESONANCE IMAGING APPARATUS

(75) Inventors: Yo Taniguchi, Kokubunji (JP); Hisaaki Ochi, Kodaira (JP); Masahiro Takizawa, Kashiwa (JP); Tetsuhiko Takahashi, Tokyo (JP)

(73) Assignee: Hitachi Medical Corporation, Tokyo (JP)

( * ) Notice: Subject to any disclaimer, the term of this patent is extended or adjusted under 35 U.S.C. 154(b) by 80 days.

(21) Appl. No.: 11/721,707

(22) PCT Filed: Dec. 22, 2005

(86) PCT No.: PCT/JP2005/023646

§ 371 (c)(1),
(2), (4) Date: Jun. 14, 2007

(87) PCT Pub. No.: WO2006/077715

PCT Pub. Date: Jul. 27, 2006

(65) Prior Publication Data

US 2008/0169808 A1 Jul. 17, 2008

(30) Foreign Application Priority Data

Jan. 20, 2005 (JP) ............................. 2005-012468

(51) Int. Cl.
*G01V 3/00* (2006.01)
(52) U.S. Cl. ....................................... 324/318; 324/309
(58) Field of Classification Search ......... 324/300–322; 600/407–435
See application file for complete search history.

(56) References Cited

U.S. PATENT DOCUMENTS 5,844,612 A * 12/1998 Israelsen ................ 375/240.14

(Continued)

OTHER PUBLICATIONS

John I. Jackson; et al.; Selection of a Convolution Function for Fourier Inversion Using Gridding; IEEE Transaction on Medical Imaging, Sep. 1991; pp. 473-478; vol. 10, No. 3.

James G. Pipe, Motion Correction With Propeller MRI: Application to Head Motion and Free-Breathing Cardiac Imaging; Magnetic Resonance in Medicine; Wiley-Liss, Inc.(1999); pp. 963-969.

(Continued)

*Primary Examiner*—Brij B Shrivastav
(74) *Attorney, Agent, or Firm*—Antonelli, Terry, Stout & Kraus, LLP.

(57) ABSTRACT

Provided is a magnetic resonance imaging apparatus capable of highly precisely detecting and compensating body motions within a short processing time during radial scanning. The magnetic resonance imaging apparatus includes a control unit that applies radiofrequency magnetic fields and magnetic field gradients to a subject lying down in a static magnetic field and that detects magnetic resonance signals generated from the subject, and an arithmetic unit that handles the signals. The arithmetic unit performs subject's body motion detection in an image space, uses an image, which is reconstructed using the low-frequency portion of the k-space data of the image, as criterial data, produces templates by moving the criterial data in advance by predetermined magnitudes of rotations and predetermined magnitudes of translations, and uses the produced templates to perform the body motion detection.

13 Claims, 9 Drawing Sheets

U.S. PATENT DOCUMENTS

| | | | |
|---|---|---|---|
| 2003/0102864 A1* | 6/2003 | Welch et al. | 324/307 |
| 2004/0155653 A1* | 8/2004 | Larson et al. | 324/309 |
| 2005/0272997 A1* | 12/2005 | Grist et al. | 600/410 |
| 2006/0224062 A1* | 10/2006 | Aggarwal et al. | 600/413 |
| 2008/0205730 A1* | 8/2008 | Stehning et al. | 382/131 |

OTHER PUBLICATIONS

Isao Muro, et al.; Effect of Motion Correction Associated with Echo Train Length and Number of Blades in Propeller MRI—Computer Simulation; Journal of Japan Radiological Society, pp. 264-269; vol. 60, No. 2.

* cited by examiner

MAGNETIC RESONANCE IMAGING APPARATUS

TECHNICAL FIELD

The present invention relates to a magnetic resonance imaging technology.

BACKGROUND ART

Nuclear magnetic resonance imaging (MRI) apparatuses are diagnostic imaging apparatuses for medical use that induce nuclear magnetic resonance in nuclei of hydrogen atoms contained in any plane traversing a subject, and that produce a tomographic image of a region contained in the plane using generated nuclear magnetic resonance signals. In general, when slice-selective magnetic field gradients are applied in order to identify a plane of a subject whose tomographic image is to be produced, excitation pulses are applied in order to excite magnetizations in the plane at the same time. Nuclear magnetic resonance signals (echoes) are produced in the course of the precession of the excited magnetizations. In order to given positional information to the magnetizations, phase-encoding magnetic field gradients and readout magnetic field gradients which are perpendicular to each other in a section are applied during a period from excitation to acquisition of the echoes. The measured echoes are mapped to a k-space having an axis of abscissas kx and an axis of ordinates ky, and inverse Fourier transform is performed in order to reconstruct an image.

The pulse and magnetic field gradients to be used to generate an echo are applied according to a predefined pulse sequence. As for the pulse sequence, various pulse sequences are known in association with different purposes. For example, a gradient echo (GrE) type high-speed imaging method is a method in which: the pulse sequence is repeatedly implemented; and the phase-encoding magnetic field gradient is sequentially changed with every repetition in order to sequentially measure the number of echoes required for producing one tomographic image.

FIG. 1 shows a pulse sequence employed in a gradient echo type hybrid radial scanning method that is one of radial scanning methods. FIG. 2 shows the map of measured echoes in the k-space. Herein, four blocks are defined in the k-space.

Actions to be performed in order to implement a pulse sequence 701 will be described below. Namely, slice-selective magnetic field gradient pulses 701-1 to 701-4 oriented in a z direction are applied, and dephasing magnetic field gradient pulses 702-1 to 702-4 and magnetization exciting radiofrequency magnetic field pulses (RF pulses) 700-1 to 700-4 whose frequency corresponds to the resonant frequency f0 of protons are applied in order to induce a nuclear magnetic resonance phenomenon in protons contained in a slice of an object concerned. After dephasing magnetic field gradient pulses 705-1 to 705-4 and 706-1 to 706-4 are applied, while readout magnetic field gradient pulses 703-1 to 703-4 and 704-1 to 704-4 are applied, nuclear magnetic resonance signals (echoes) 707-1 to 707-4 are measured. The pulse sequence 701 is composed of four parts 708-1, 708-2, 708-3, and 708-4, each of which is repeated Cr times while the magnitudes of the dephasing magnetic field gradient pulses 705-1 to 705-4 and 706-1 to 706-4 are varied. The echoes 707-1, 707-2, 707-3, and 707-4 measured with the respective parts are mapped to blocks 1, 2, 3, and 4 that are equidistantly defined in a θ direction as shown in FIG. 2. The positions of the echoes in the blocks are determined with the magnitudes of the pulses 705-1 to 705-4 and 706-1 to 706-4.

The k-space is converted into a Cartesian grid using a gridding technique (refer to, for example, non-patent document 1). Thereafter, two-dimensional inverse Fourier transform is performed in order to reconstruct an image. An imaging time per image is a product of the time (repetition time TR) from the beginning of the part 708-1 to the end of the part 708-1 and the number of echoes. For example, when TR equals 4 ms and 128 echoes are used to reconstruct one image, the imaging time comes to 512 ms.

According to the imaging method, data in the central region of the k-space equivalent to a low-spatial frequency portion of an image is repeatedly acquired as shown in FIG. 2. The center of the k-space shall be referred to as a reference domain 222. A method in which the reference domain 222 is used to compensate rotations and translations out of the motions of the subject rendered by the blocks has been proposed (refer to, for example, non-patent document 2). According to the method, after a magnitude of rotation is detected and compensated, a magnitude of translation is detected and compensated.

In rotation detection, since the rotation of an image space leads to the rotation of absolute values in the k-space, correlation is performed in the k-space. Gridding is performed on each of the blocks within the reference domain in the k-space, and a mean of each block within the reference domain is regarded as criterial data. While the reference-domain data of each block is rotated, gridding is performed in order to obtain an angle maximizing the value of the correlation to the criterial data.

As for a magnitude of translation, a mean of reference-domain data of each of the blocks having undergone gridding after the completion of rotation compensation is adopted as criterial data. A product of the criterial data by the reference-domain data of each of the blocks is Fourier-transformed. The position indicated by the peak among the resultant data sets is used to detect the magnitude of translation.

As for filling of the k-space with data, according to an enhanced reconstruction method using periodically rotated overlapping parallel lines, data of a bundle of echoes (blade) acquired after every excitation is subjected to two-dimensional Fourier transform and then to positional correction (refer to, for example, non-patent document 3).

Non-patent document 1: "Selection of a Convolution Function for Fourier Inversion Using Gridding" by Jackson JI, Meyer CH, Nishimura DG (IEEE Trans. Med. Imaging, Vol. 10, No. 3, pp. 473-478, 1991)

Non-patent document 2: "Motion Correction With PROPELLER MRI: Application to Head Motion and Free-breathing Cardiac Imaging" by J. G. Pipe (Magn. Reson. Med., pp. 963-969, 1999)

Non-patent document 3: "Effect on Motion Correction of an Echo Train Length and the Number of Blades set for PROPELLER MRI (Computer Simulation)" (Journal of Japan Radiological Society, Vol. 60, No. 2, pp. 264-269)

DISCLOSURE OF THE INVENTION

Problem to be Solved by the Invention

According to the aforesaid method, data that is a mean of a reference domain is adopted as criterial data for production of one image. The method cannot therefore be applied to continuous imaging to be performed for measurement of cerebral functions (functional MRI (fMRI)). Moreover, processing in the k-space is susceptible to noise. When data of a diffusion weighted image or the like affected by a low signal-to-noise ratio has to be handled, precision in detection is degraded.

Furthermore, for rotation detection, the criterial data is fixed and reference-domain data of each block is rotated. Therefore, efficiency in calculation is poor.

An object of the present invention is to provide a magnetic resonance imaging apparatus capable of detecting and compensating body motions highly precisely using a short processing time during radial scanning.

Means for Solving the Problem

In order to accomplish the above object, the present invention is basically configured in such a manner that: motion detection is performed in an image space; an image reconstructed using a low-frequency portion of k-space data of an image is adopted as criterial data; templates are produced by moving the criterial data in advance by predetermined magnitudes of rotation and predetermined magnitudes of translations; and detection is then performed.

A typical example of the configuration of a magnetic resonance imaging apparatus in accordance with the present invention will be described below.

(A) The magnetic resonance imaging apparatus includes a control unit that controls a pulse sequence according to which radiofrequency magnetic fields and magnetic field gradients are applied to a subject lying down in a static magnetic field in order to detect magnetic resonance signals generated from the subject, and an arithmetic unit that handles the signals. The control unit (1) controls the pulse sequence required for performing radial scanning, (2) controls acquisition of a first group of echoes by implementing the pulse sequence, and (3) controls acquisition of an n-th (where n denotes an integer equal to or larger than 2) group of echoes by implementing the pulse sequence. The arithmetic unit performs the following pieces of processing:
(1) reconstruction of a first low-resolution absolute-value image using a low-frequency portion of k-space data of the first group of echoes;
(2) production of rotation templates that are multiple images produced by rotating the low-resolution absolute-value image by different angles;
(3) production of translation templates that are multiple images produced by translating the low-resolution absolute-value image by different distances;
(4) reconstruction of an n-th low-resolution absolute-value image using a low-frequency portion of k-space data of the n-th group of echoes;
(5) rotation of the n-th low-resolution image by a magnitude of rotation indicated by the rotation template matched with the n-th low-resolution image;
(6) translation of the n-th low-resolution image by a magnitude of translation indicated by the translation template matched with the n-th low-resolution image; and
(7) repetition of the pieces of processing (5) and (6) until the magnitudes of rotation and translation become nearly zero by alternately performing the pieces of processing, or repetition thereof a predefined upper limit of the number of times.

(B) In the magnetic resonance imaging apparatus having the foregoing configuration, the rotation templates include outline rotation templates and detailed rotation templates indicating a smaller difference in an angle than the outline rotation templates. The translation templates include outline translation templates and detailed translation templates indicating a smaller difference in a translation distance than the outline translation template. For the pieces of processing (5) and (6) of the first time, the outline rotation templates and outline translation templates are used. For the pieces of processing (5) and (6) of the second and succeeding times, the detailed rotation templates and detailed translation templates are used.

Effect of the Invention

According to the present invention, the employment of the templates makes it possible to detect body motions for a short period of time. Moreover, since an image domain is handled, the body motions can be highly precisely detected even in an image affected by a low signal-to-noise ratio.

BEST MODE FOR CARRYING OUT THE INVENTION

Referring to the drawings, an embodiment of the present invention will be described below.

FIG. 8 is a block diagram showing the outline configuration of a magnetic resonance imaging apparatus to which the present invention is applied.

In FIG. 8, reference numeral 101 denotes a magnet that generates a static magnetic field, reference numeral 102 denotes coils that generate magnetic field gradients, and reference numeral 103 denotes a subject (for example, a living body) who is carried into a space of a static magnetic field generated by the magnet 101. A sequencer 104 issues an instruction to a magnetic field gradient power supply 105 and a radiofrequency magnetic field generator 106 which generate a magnetic field gradient and a radiofrequency magnetic field respectively. The radiofrequency magnetic field is applied to the subject 103 via a probe 107. A signal generated from the subject 103 is received by the probe 107 and detected by a receiver 108. A nuclear magnetic resonant frequency to be used as a criterion for detection (hereinafter, a detection criterial frequency) is determined by the sequencer 104. The detected signal is sent to a computer 109 that performs signal processing including image reconstruction. The results of signal processing are displayed on a display 110. If necessary, the detected signal and the conditions for measurement may be stored in a storage medium 111.

When the homogeneity of a static magnetic field has to be regulated, shim coils 112 are employed. The shim coils 112 include multiple channels and have power supplied from a shim power supply 113. During the regulation of the homogeneity of the static magnetic field, the sequencer 104 controls currents that flow into the respective shim coils. The sequencer 104 issues an instruction to the shim power supply 113 so that the coils 112 will generate auxiliary magnetic fields with which the inhomogeneity of the static magnetic field can be corrected.

The sequencer 104 extends control so that the units will operate at the preprogrammed timings and intensities. Among the programs, a program describing the timings and intensities of radiofrequency magnetic fields, magnetic field gradients, and a received signal alike is called a pulse sequence.

The present embodiment will be described on the assumption that the pulse sequence employed in the gradient echo type hybrid radial scanning method shown in FIG. 1 is adopted in order to reconstruct one image.

In body motion detection, templates are produced in advance by rotating and translating a reference image represented by block 1. The template images are matched against reference images represented by blocks 2 to bl, whereby magnitudes of rotations theta[k] and magnitudes of translations dx[k], dy[k] (k ranges from 1 to bl) are obtained. The matching is to search for a template whose difference from a reference image is the smallest. The detected magnitudes of rotations and detected magnitudes of translations are used to compensate the rotations and translations represented by reconstruction data. The translations are compensated in the k-space using the magnitudes of translations dx, dy obtained during body motion detection. The rotations are compensated by modifying the angles to be represented by the blocks during gridding that is performed later. The reconstruction data corrected to compensate the translation and the magnitudes of rotations theta[k] are handed as input data to be handled during the gridding.

The compensation is, as shown in FIG. 7, performed every time one block data is measured.
(1) Phase-corrected data of block 1 is used to produce a reference image, and body motion detection templates are produced.
(2) A reference image produced using phase-corrected data of block 2 and the templates produced during the processing (1) are used to detect a magnitude of rotation and a magnitude of translation.
(3) Whether detection is achieved normally is recorded.
(4) The detected magnitude of rotation is recorded. The magnitude of translation is used to correct the data of the block 2.
(5) The pieces of processing (2) to (4) are repeatedly performed on blocks ending with block bl.
(6) The pieces of processing (1) to (4) are repeatedly performed on a block relative to which detection has not been normally achieved.
(7) The block data sets corrected to compensate a translation and the recorded magnitudes of rotations are used to perform gridding, whereby an image is reconstructed.

Whether detection is normally achieved is decided by checking if the minimum value of an objective function is larger than the value thereof relative to any other block or if an objective function does not assume a minimal value within a range defined by the templates. As for re-measurement of a block relative to which detection has not been normally achieved, blocks that have to be re-measured may be measured at one time during the processing (6). Otherwise, blocks that have to be re-measured may be measured during the measurement of the blocks 2 to bl.

A processing flow will be described in conjunction with the flowchart of FIG. 3 by taking for instance a case where the number of blocks is, as shown in FIG. 2, four (bl=4).

To begin with, as shown in FIG. 4, reference domain data 805 of block 1 is reconstructed (301) in order to produce a reference image (absolute-value image) (302) (step 501). The number of pixels is provided as a product of Cr by Cr on the assumption that the number of echoes constituting one block is Cr. However, when Cr is too small, if the precision in motion detection is poor, the number of pixels is set to a product of 32 by 32 by filling the block with zeros. This may improve the precision. A reference image represented by block i is produced by performing interpolative image production, which will be described later, with an angle of rotation set to theta[0]=(0.5+i−1)π/bl. Consequently, angles represented by the blocks are canceled in the respective reference images. This will improve the convergence of rotation detection. Moreover, a shift of the angles by 0.5π/bl provides interpolative images as all images to be processed. A change exhibited by an objective function gets smoothed and an error of the minimum value thereof can be reduced.

After the completion of the above processing, reference images are subjected to centering in advance in order to improve the convergence of rotation detection. Specifically, projection images are produced by projecting a reference image in x and y directions respectively, and translated so that the portions of the projection images whose values are equal to or larger than (a maximum intensity value) x (threshold) will come to the center of a field of view. Now, the magnitude of translation shall be expressed as dx[1], dy[1]. The threshold that depends on image quality is normally set to about 0.4.

Thereafter, the reference image represented by block 1 is used to produce templates (step 502). The templates include two kinds of templates, that is, rotation templates for use in detecting a rotation and translation templates for use in detecting a translation. The rotation templates correspond to a sum of sets, that is, a set A of images produced by rotating the reference image in steps of an angle of rotation (that is, in units of an outline rotation detection step) within a range from a negative outline rotation detection range to a positive outline rotation detection range, and a set B of images produced by rotating the reference image in steps of an angle of rotation (that is, in units of a detailed rotation detection step) within a range from a negative detailed rotation detection range to a positive detailed rotation detection range. The reference image is rotated by performing interpolative image production that will be described later. In FIG. 4, the angle of rotation relevant to the set A is larger than the angle of rotation relevant to the set B.

FIG. 2 shows, for brevity's sake, a case where a quotient of an outline rotation detection range by an outline rotation detection step is 1, a quotient of a detailed rotation detection range by a detailed rotation detection step is 1, a quotient of an outline translation detection range by an outline translation detection step is 1, and a quotient of a detailed translation detection range by a detailed translation detection step is 1.

The outline rotation detection range is determined to cover a range within which a rotational movement of a subject is predicted. In normal imaging, the outline rotation detection range is set to, for example, 16°. The smaller the detailed rotation detection step is, the higher the precision in rotation detection is. However, a processing time gets longer. Normally, the detailed rotation detection step is set to about 1°. The outline rotation detection step is about several times larger than the detailed rotation detection step and is normally set to about 2°. The detailed rotation detection range is about twice larger than the outline rotation detection step and is normally set to about 8°.

On the other hand, the translation templates correspond to a sum of sets, that is, a set C of images produced by translating a reference image in both the x and y directions in steps of a translation (that is, in units of an outline translation detection step) within a range from a negative outline translation detection range to a positive outline translation detection range, and a set D of images produced by translating the reference image in both the x and y directions in steps of a translation (that is, in units of a detailed translation detection step) within a range from a negative detailed translation detection range to a positive translation detection range. The translation is made by converting the reference image into data defined in the k-space and changing the phase. In FIG. 4, the magnitude of translation relevant to the set C is larger than the magnitude of translation relevant to the set D.

The outline translation detection range is determined to cover a range in which a translation of a subject is predicted. In normal imaging (128 pixels), the outline translation detection range is set to, for example, 6 pixels. The smaller the detailed translation detection step is, the higher the precision in the translation detection is. However, a processing time gets longer. Normally, the detailed translation detection step is set to about 1 pixel. The outline translation detection step is about several times larger than the detailed translation detection step, and is normally set to about 3 pixels. The detailed translation detection range is about twice larger than the outline translation detection step, and is normally set to 2 pixels.

By modifying the templates, the precision in detection and a processing speed can be adjusted. For satisfactory precision, the detection ranges are widened and the detection steps are decreased. For a shorter processing time, the detection ranges are narrowed and the detection steps are increased.

Body motion detection to be described below is performed on each of blocks 2 to bl (step 503). To begin with, a reference image represented by block k is produced (step 504). Thereafter, rotation detection of the first time and translation detection thereof are performed (steps 506 and 507). Herein, the reference image is matched against the templates in order to detect a magnitude of rotation and a magnitude of translation. The detections are performed in order of rotation detection of the first time, translation detection of the first time, rotation detection of the second time, translation detection of the second time, rotation detection of the third time, translation detection of the third time, etc. When the magnitude of rotation (or magnitude of translation) and an immediately preceding magnitude of rotation (or an immediately preceding magnitude of translation) satisfy a rotation detection convergence decision value and a translation detection convergence decision value (steps 508, 511, and 513) or when the number of repetition times reaches a maximum value (step 515), the detections are terminated. For example, the rotation detection convergence decision value and translation detection convergence decision value are 0.05° and 0.01 pixel respectively, and the maximum value of the number of repetition times is on the order of 10.

The solution of rotation detection of the first time (step 506) is an angle of rotation minimizing an objective function expressing the relationship between the reference image represented by the block k and each of the images included in the outline rotation templates. Herein, the objective function may be a function expressing a difference between two images, and provide, for example, a sum of squared differences between pairs of images. Moreover, since the angles of rotations indicated by the respective images prepared as the template are discrete values, values of the objective function to be sampled become discrete. For deduction of a minimum value, interpolation (normally a cubic function) is employed.

FIG. 5 shows an example of a graph drawn by plotting the values of the objective function. Using the graph, an angle of rotation associated with the minimum value of the objective function is found to be —5.12°. The angle is regarded as a magnitude of rotation theta[k,l].

Now, the reference image is rotated by the detected angle of rotation theta[k,l]. This processing is achieved by performing interpolative image production to be described later.

Thereafter, the reference image is matched against the outline translation templates, wherein translation detection of the first time is performed (step 507). In the translation detection, an objective function is a quadratic function. For deducing the minimum value of the objective function, two-dimensional interpolation is employed. As for the degree of a function to be obtained by performing interpolation, the function is normally a cubic function.

FIG. 6 shows an example of a graph indicating the values of an objective function in the form of a shaded image. Using the graph, a magnitude of translation associated with the minimum value of the objective function is found to be (−1.43, 0.27) pixel. The obtained magnitude of translation shall be expressed as (dx[k,2], dy[k,2]).

Now, the reference image is moved by the detected magnitude of rotation and by the detected magnitude of translation. This processing is achieved by performing interpolative image production to be described later.

Thereafter, whether rotation detection and translation detection are converged is decided (step 508). As for convergence decision, when an immediately preceding magnitude of rotation or an immediately preceding magnitude of translation is smaller than a predetermined value (convergence decision value), the rotation detection or translation detection shall be said to be converged. Control is then jumped to step 516. For example, assuming that the convergence decision value for translation detection is 0.01 pixel and the convergence decision value for rotation detection is 0.05°, satisfactory precision is ensured for the detections.

If convergence decision (step 508) reveals that rotation detection and translation detection are not converged, rotation detection of the second time or thereafter and translation detection thereof are continued.

First, the number of body motion detection times, kk, is set to 2 (step 509). Thereafter, similarly to step 506, rotation detection and rotation are performed (step 510). Thereafter, similarly to step 508, convergence decision is performed (step 511). If rotation detection is converged, control is jumped to step 516. Otherwise, similarly to step 507, translation detection and translation are performed (step 512). Thereafter, similarly to step 508, convergence decision is performed (step 513). If translation detection is converged, control is jumped to step 516. Otherwise, the number of times kk is incremented by one (step 514). The pieces of processing of steps 510 to 514 are repeated until the number of times kk comes to nk (step 515). Herein, nk denotes a maximum number of body motion detection times designated in advance. Normally, nk is set to about 10 for satisfactory precision in detection. Even when the nk value is set to about 10 or more, as long as normal imaging is performed, a calculation time increases but the precision in detection hardly improves.

When the foregoing pieces of processing are completed, a magnitude of rotation and a magnitude of translation are calculated (step 516). Thereafter, the k value is incremented by one (step 517). Steps 504 to 517 are repeated until all blocks are handled (step 518).

In the course of body motion detection, a reference image reflecting the history of detections is produced by performing linear interpolation (interpolative image production). For expansion of the history of detections, a rotation/translation history expansion function is employed. The rotation/translation history expansion function is a function for expanding the history of rotations or translations so as to transform coordinates. Assuming that a rotation history is provided as theta[kk] and a translation history is provided as dx[kk], dy[kk] (where k denotes 1, etc., or nk), (x, y) is transformed as expressed by the formula 1 presented below. Herein, nk denotes a maximum number of times, theta[k,kk] denotes a magnitude of rotation of the kk-th time, and (dx[k,kk+1], dy[k,kk+1]) denotes a magnitude of translation of the kk-th time.

[Formula 1]

$$\begin{bmatrix} x' \\ y' \end{bmatrix} = Rot(\text{theta}[0]) \cdot \quad (1)$$

$$\left( Rot\left( \sum_{i=1}^{nk} -\text{theta}[i] \cdot \begin{bmatrix} x \\ y \end{bmatrix} - \begin{bmatrix} dx[1] \\ dY[1] \end{bmatrix} \right) - \right.$$

$$\left. \sum_{i=2}^{nk} Rot\left( \sum_{j=1}^{i-1} -\text{theta}[j] \cdot \begin{bmatrix} x \\ y \end{bmatrix} \right) \right)$$

$$Rot(\alpha) = \begin{bmatrix} \cos\alpha & \sin\alpha \\ -\sin\alpha & \cos\alpha \end{bmatrix}$$

After body motion detection is completed, data to be subjected to gridding is produced. A final magnitude of rotation θ that is a solution is provided by the formula 2 under the condition of (a, b)=xy(1,0)−xy(0,0).

[Formula 2]

$$\theta = \begin{cases} \cos^{-1}(a) & b > 0 \\ -\cos^{-1}(a) & \text{else} \end{cases} \quad (2)$$

The data is passed to a gridding routine. Translation compensation is performed on the data before the data is passed to the gridding routine. A magnitude of translation to be compensated is expressed by a constant term of a history expansion function as (c,d)=xy(0,0). The phase represented by original block data is corrected by the magnitude of movement. The obtained magnitude of rotation and the block data that is translated are subjected to gridding in order to produce an image.

Through the foregoing processing, body motions can be detected for a short period of time and an image devoid of artifacts can be reconstructed. Since an image domain is handled, even when an image is affected by a low signal-to-noise ratio, body motions can be highly precisely detected.

Next, a description will be made of a case where multiple images are successively produced. This case refers to, for example, cerebral function imaging. In the cerebral function imaging, for example, imaging is continuously performed for five min at intervals of 1 sec in order to reconstruct a total of three hundred images. During the imaging, a subject is asked to alternate in units of 1 min a state in which the subject performs nothing (rest state) and an active state in which the subject moves his/her fingers or the like (task state). After the completion of the imaging, a mean of images produced in the first rest state is subtracted from successive images, and statistical processing is performed in order to sample data of an active cerebral region. When the subject makes a motion during imaging, images deviate from each other. When a difference between the images is detected, images of the same region cannot be associated with each other. Therefore, all images have to express the same position. The application of the method in accordance with the present embodiment permits correction of one image. However, images are corrected, though they express different positions. In order to eliminate a positional deviation between images, templates produced based on one block is used to detect and compensate a body motion represented by each of blocks constituting every image data. Consequently, all images produced during continuous imaging will express the same position.

Next, a description will be made of a case where one image is reconstructed using the pulse sequence employed in a gradient echo type radial scanning method.

Actions to be performed according to the pulse sequence will be described below. Along with the application of a slice-selective magnetic field gradient pulse 201 oriented in a z direction, a magnetization exciting radiofrequency magnetic field (RF) pulse 202 whose frequency corresponds to the resonant frequency f0 of protons is applied in order to induce a nuclear magnetic resonance phenomenon in protons contained in a certain slice of an object. After dephasing magnetic field gradient pulses 203, 204, and 205 are applied, while readout magnetic field gradient pulses 206 and 207 are applied, a nuclear magnetic resonance signal (echo) 208 is measured. After the echo is measured, rephasing magnetic field gradient pulses 209, 210, and 211 are applied in order to restore the phase of a magnetization in preparation for the next excitation. The above procedure is repeated Ne times with a repetition time TR fixed in order to measure Ne echoes. The echoes are mapped to the k-space.

The dephasing magnetic field gradient pulse 204 and rephasing magnetic field gradient pulse 209 change from −1Ne/2 to Ne/2−1. The dephasing magnetic field gradient pulse 205 and rephasing magnetic field gradient pulse 209 change from 0 through −Ne/2 to −1. The readout magnetic field gradient pulse 206 changes from Ne/2 to −Ne/2−1. The readout magnetic field gradient pulse 207 changes from 0 through Ne/2 to 1. The changes are determined so that the echoes will be mapped to four blocks (117-1 to 117-4) in the k-space.

FIG. 10 shows the k-space. The echoes are mapped to the blocks in such a manner that: an angle of rotation 802 represented by the echoes is 4×180/Ne°; and offsets 118-1 to 118-4 in the angle of rotation are 0° (FIG. 10A), 180/Ne° (FIG. 10B), 2×180/Ne° (FIG. 10C), and 3×180/Ne° (FIG. 10D).

The four blocks are used to perform body motion detection/compensation according to the flowchart of FIG. 3. What differs from a case where a hybrid radial scanning method is adopted is only a method of producing a reference image. When the hybrid radial scanning method is adopted, the reference domain is a circular domain 115 shown in FIG. 10. The diameter of the reference domain 115 is equivalent to the number of echoes Cr to be mapped to one block. For example, when Ne equals 128 and the number of blocks is 4, the number of echoes Cr is 32. The reference image is produced by performing gridding on data within the domain. The matrix size of the reference image shall be Cr in columns and Cr in rows. However, when Cr is too small, if the precision in detecting a motion is poor, the number of pixels may be set to a product of 32 by 2 by filling the reference image with zeroes after the completion of gridding. This may improve the precision. An angle of rotation expressed by the reference image of a block i shall be theta[0]=0.

Moreover, the reference image is subjected to centering in advance in order to improve the convergence of rotation detection to be performed later. Specifically, projection images are produced by projecting the reference image in the x and y directions respectively. The projection images are each translated so that a domain of values equal to or larger than (a maximum intensity value)×(threshold) will come to the center of a field of view. The magnitude of translation shall be expressed as dx[1], dy[1]. The threshold depends on image quality and is normally on the order of 0.4. Subsequent body motion detection and compensation are identical to those in the case where the hybrid radial scanning method is adopted. Corrected data is, as shown in FIG. 10E, mapped to the k-space 116 and an image is reconstructed by performing gridding.

Owing to the foregoing method, even when radial scanning is adopted, a body motion can be detected and compensated, and an image devoid of a positional deviation or artifacts can be produced.

INDUSTRIAL APPLICABILITY

The magnetic resonance imaging technology in accordance with the present invention uses templates to detect body motions for a short period of time. Moreover, since an image domain is handled, even if an image is affected by a low signal-to-noise ratio, the body motions can be highly precisely detected. The present invention highly significantly contributes to medicine and industries alike.

DESCRIPTION OF REFERENCE NUMERALS

Figure 1:
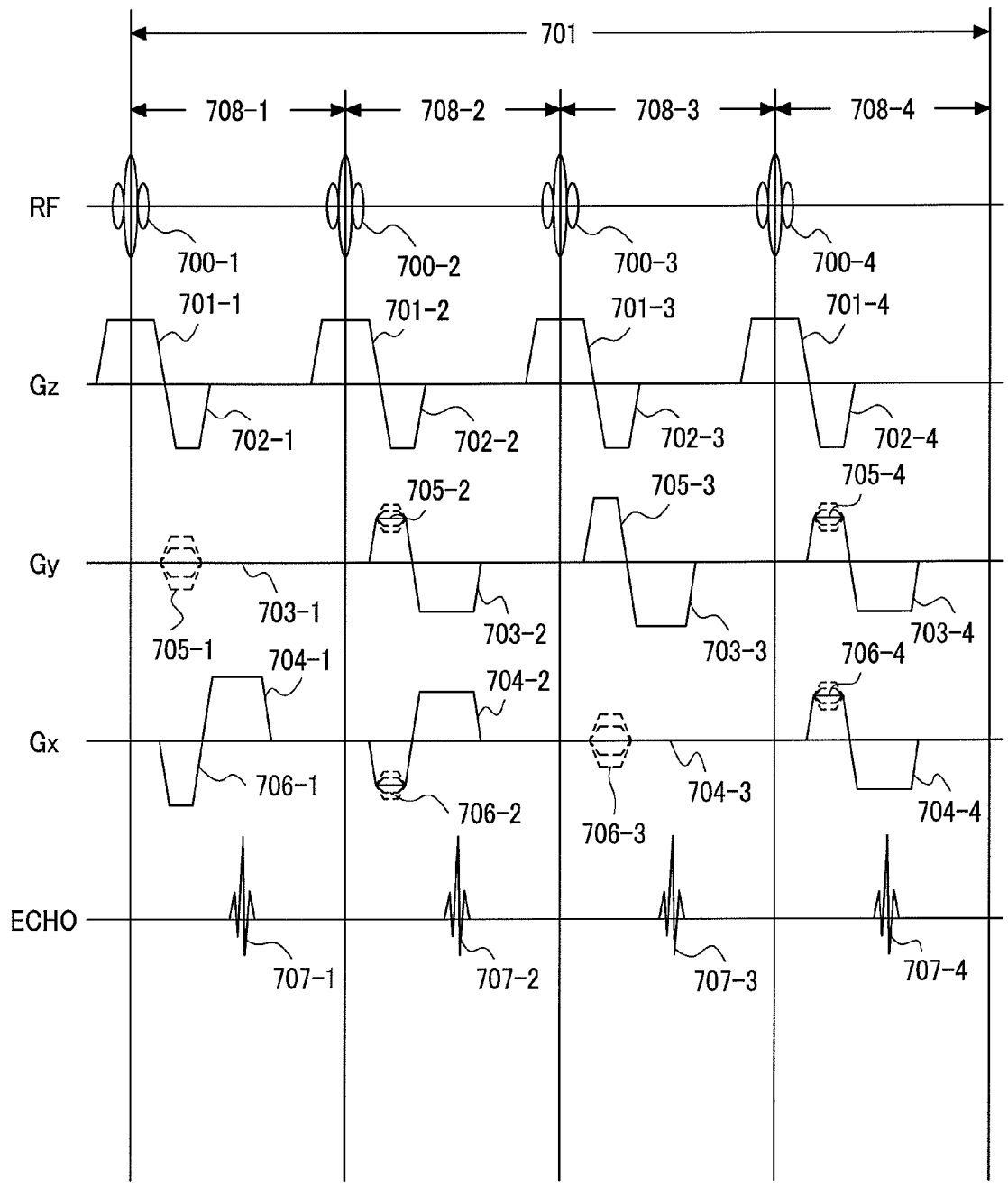
FIG. 1 is an explanatory diagram showing a pulse sequence employed in a conventional gradient echo type hybrid radial scanning method.
Figure 2:
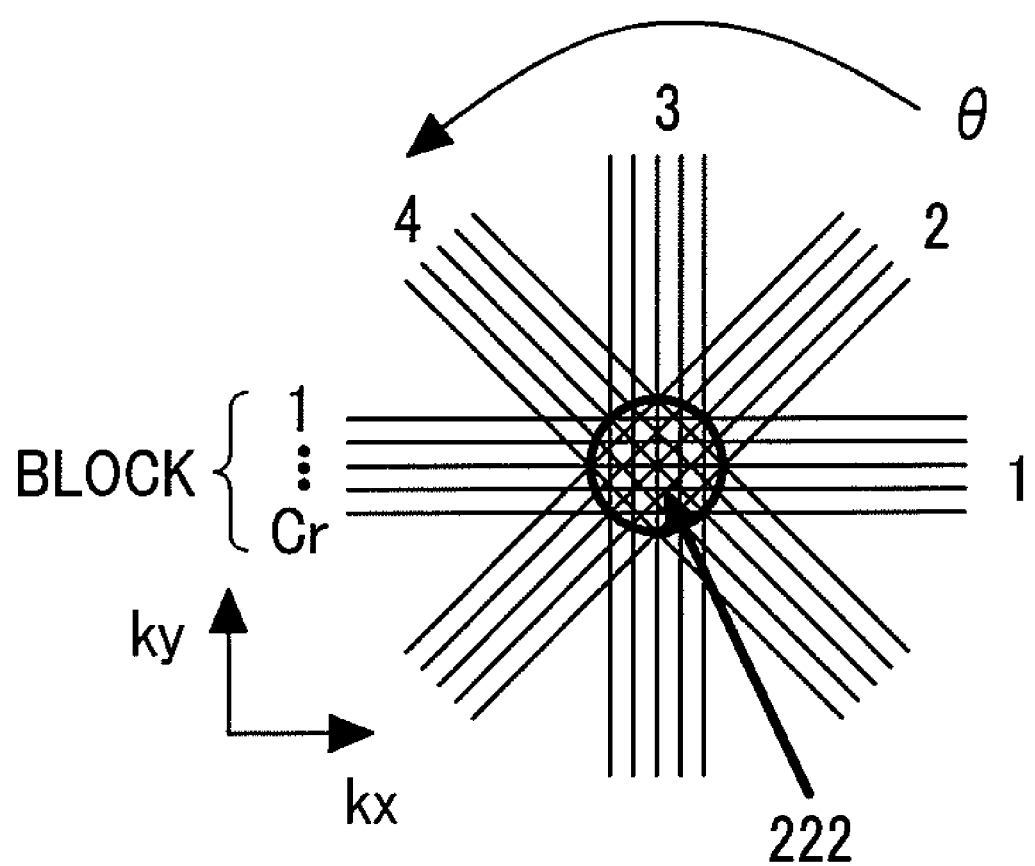
FIG. 2 is an explanatory diagram showing a k-space defined for the conventional gradient echo type hybrid radial scanning method.
Figure 3:
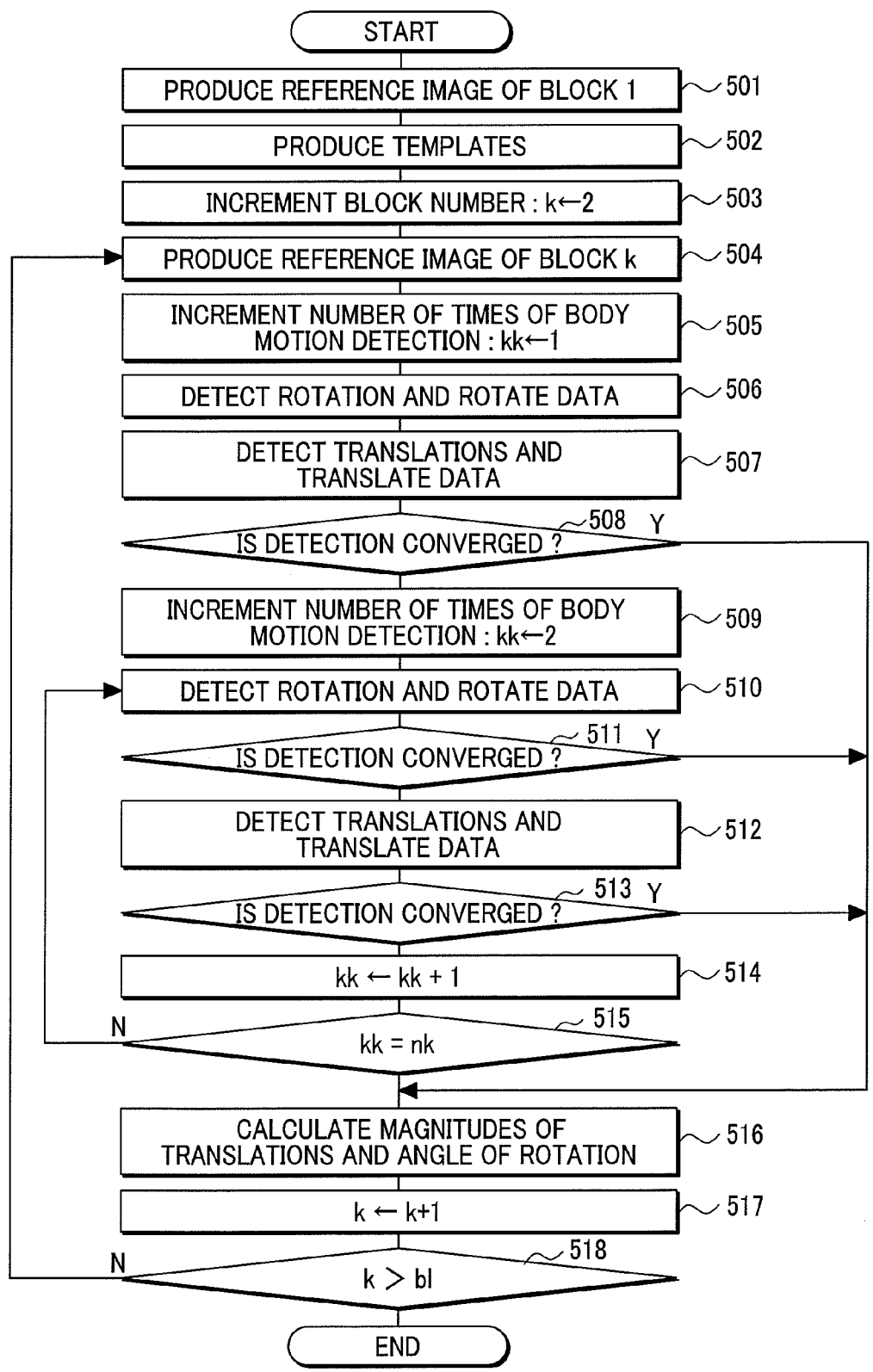
FIG. 3 is a flowchart describing body motion detection to be performed in an embodiment of the present invention.
Figure 4:
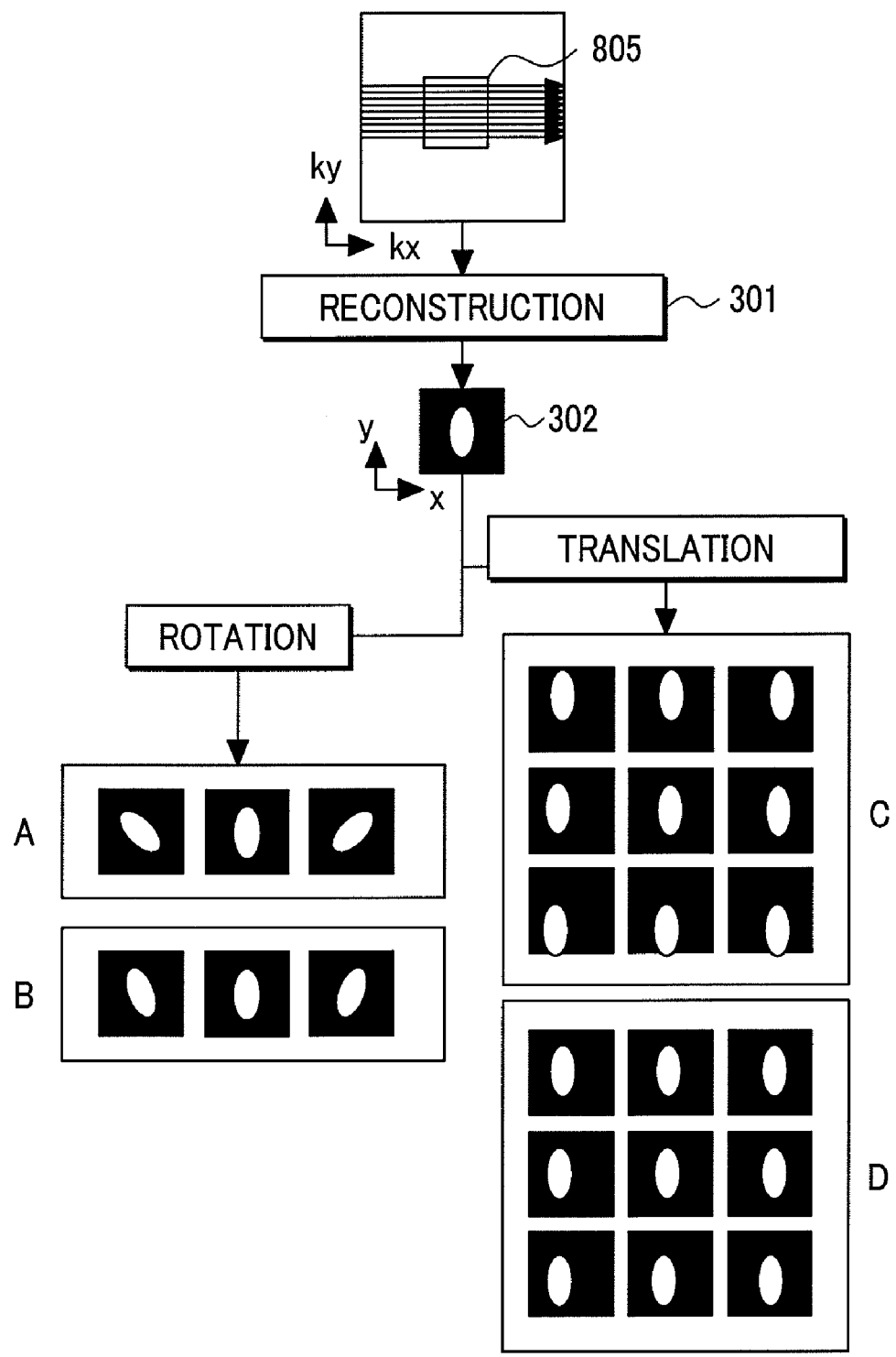
FIG. 4 is an explanatory diagram showing templates employed in the embodiment of the present invention.
Figure 5:
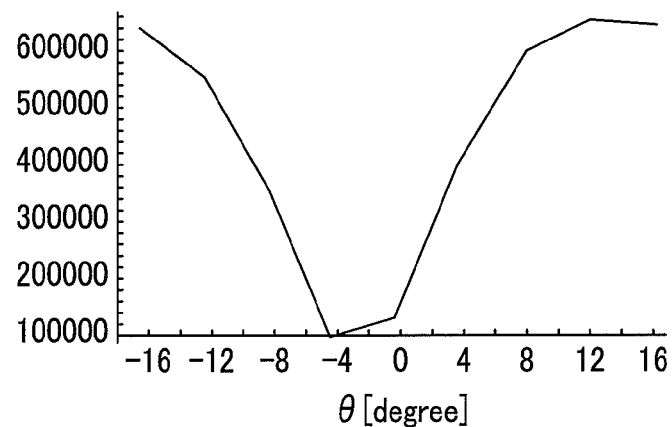
FIG. 5 shows a change exhibited by an objective function during rotation detection performed in the embodiment of the present invention.
Figure 6:
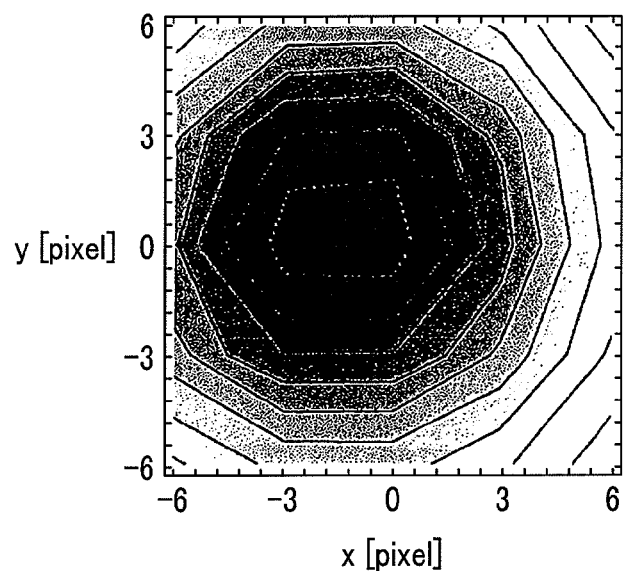
FIG. 6 shows a change exhibited by an objective function during translation detection performed in the embodiment of the present invention.
Figure 7:
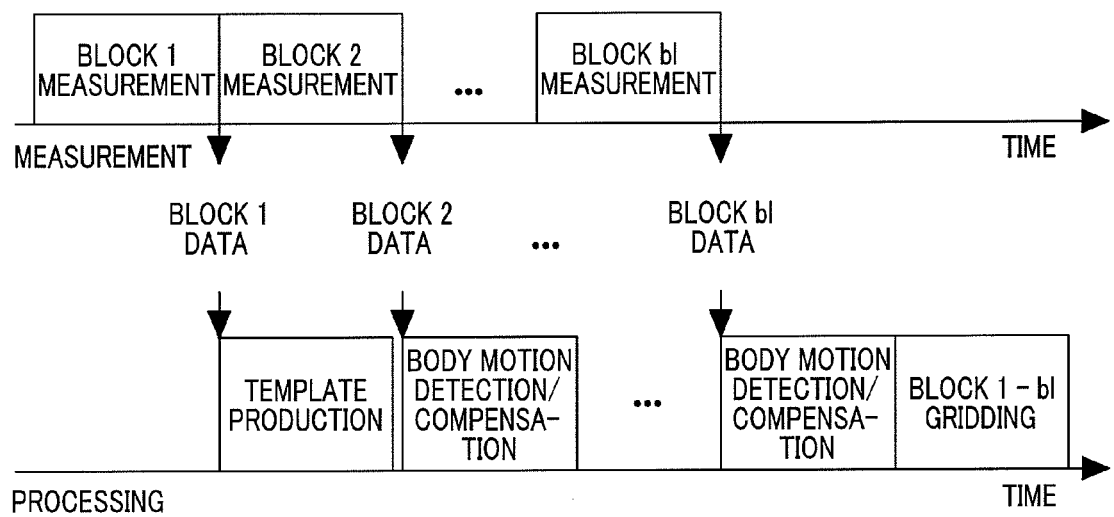
FIG. 7 is an explanatory diagram showing timings of measurement and processing employed in the embodiment of the present invention.
Figure 8:
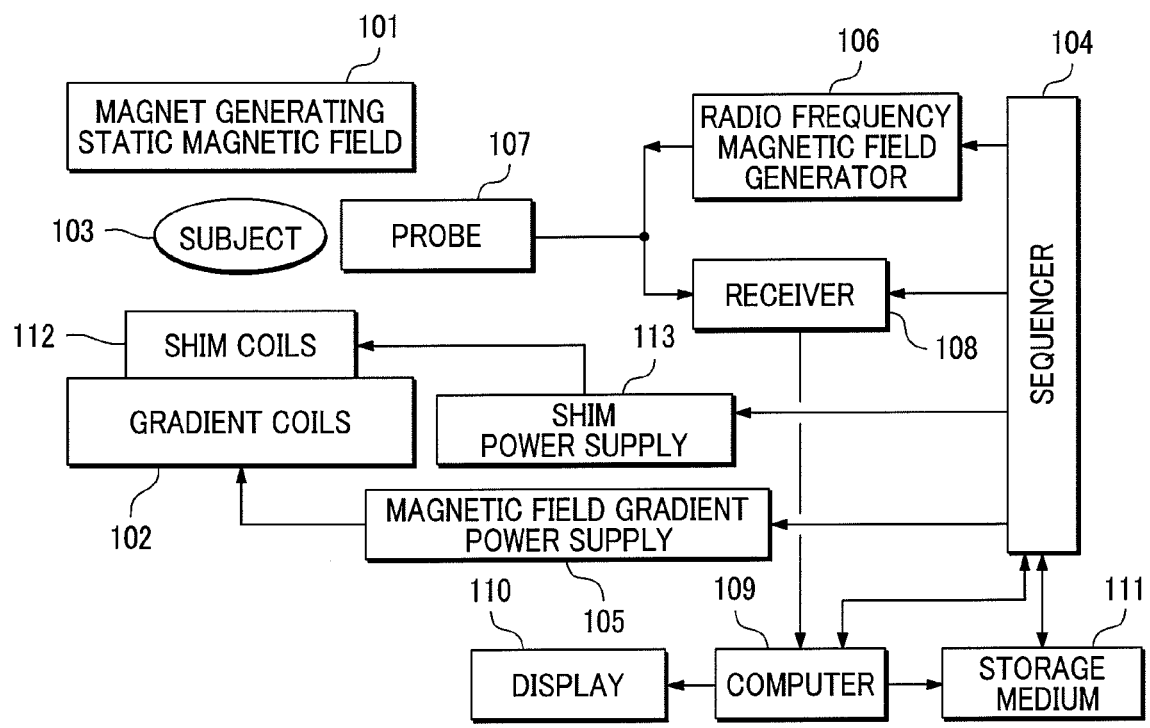
FIG. 8 shows an example of the configuration of a nuclear magnetic resonance imaging apparatus to which the present invention is applied.
Figure 9:
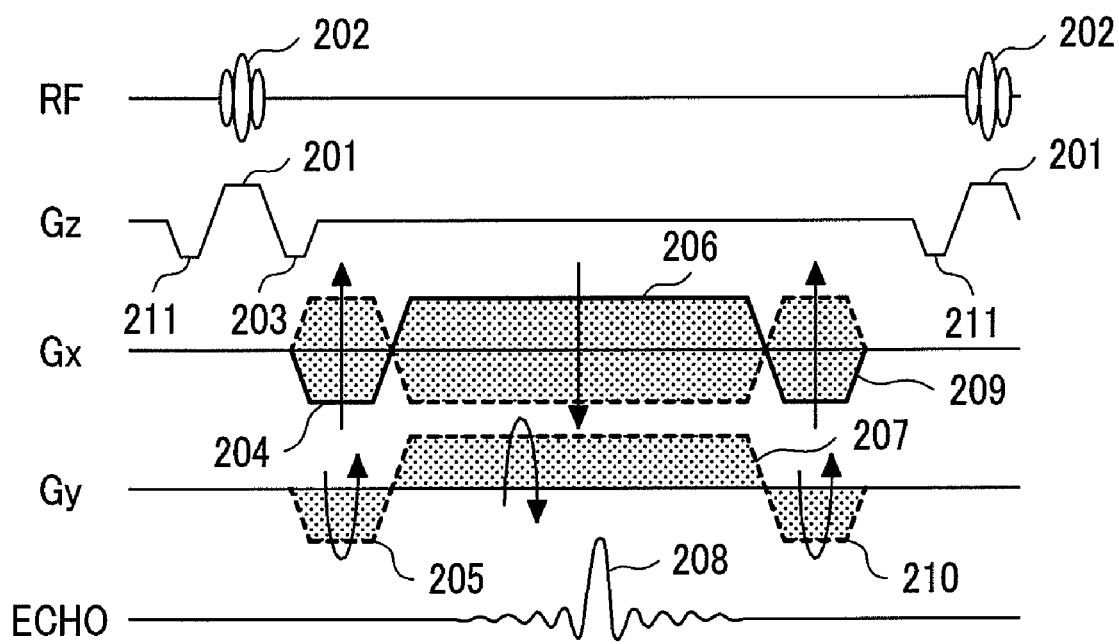
FIG. 9 is an explanatory diagram showing a pulse sequence employed in a gradient echo type radial scanning method according to the embodiment of the present invention.
Figure 10A:
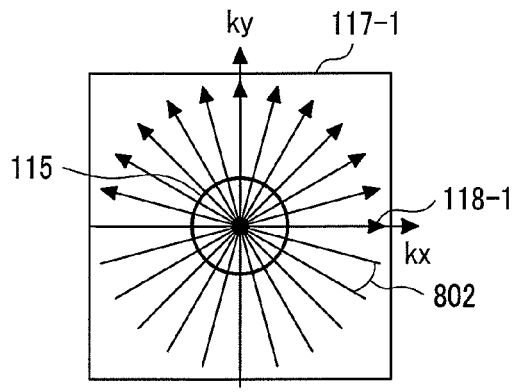
FIGS. 10A to 10E are explanatory diagrams showing blocks defined for a radial scanning method according to the embodiment of the present invention.
Figure 10B:
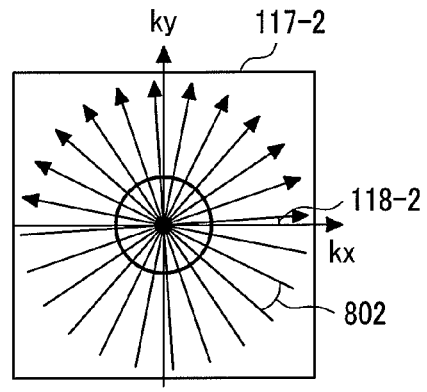
Figure 10C:
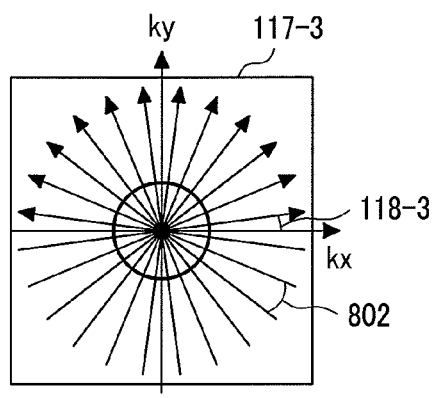
Figure 10D:
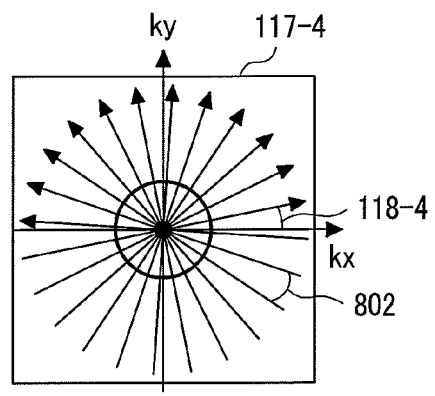
Figure 10E:
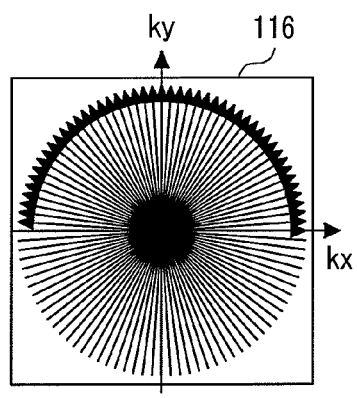

101: magnet that generates a static magnetic field, 102: gradient coils, 103: subject, 104: sequencer, 105: magnetic field gradient power supply, 106: radiofrequency magnetic field generator, 107: probe, 108: receiver, 109: computer, 110: display, 111: storage medium, 112: shim coils, 113: shim power supply, 115: reference domain, 116: k-space, 201: slice-selective magnetic field gradient pulse, 202: magnetization exciting radiofrequency magnetic field (RF) pulse, 203 to 205: dephasing magnetic field gradient pulse, 206, 207: readout magnetic field gradient pulse, 208: echo, 209 to 211: rephasing magnetic field gradient pulse, 222: reference domain, 301: reconstruction, 302: reference image (absolute-value image), 805: reference domain data.

The invention claimed is:

1. A magnetic resonance imaging apparatus comprising:
   a static magnetic field generation means for generating a static magnetic field in a space in which a subject lies down;
   a magnetic field gradient generation means for generating magnetic field gradients in the space;
   a radiofrequency magnetic field generation means for irradiating a radiofrequency magnetic field pulse, which induces nuclear magnetic resonance, to atomic nuclear spins in the subject;
   an echo signal reception means for detecting an echo signal derived from the nuclear magnetic resonance;
   a measurement control means for controlling the magnetic field gradient generation means, radiofrequency magnetic field generation means, and echo signal reception means so that the k-space to which data sets of echo signals are mapped will be measured by dividing the k-space into a plurality of blocks each of which contains a measurement trajectory passing through the origin of the k-space and whose measurement trajectories form different angles with respect to one of the coordinate axes of the k-space;
   a body motion compensation means for selecting a criterial block from among the plurality of blocks, detecting a body motion of the subject that has occurred between measurement of the criterial block and measurement of any other block, and compensating the body motion represented by the other block data by correcting the other block data so as to eliminate the adverse effect of the body motion on an image;
   a synthesis means for remapping the block data sets to the common k-space and synthesizing them; and
   an image reconstruction means for reconstructing an image using the common k-space data,
   wherein the body motion compensation means compensates the body motion represented by the other block data on the basis of the differences of a reference image, which is reconstructed using at least part of the data of the other block, from a plurality of different templates produced by moving a criterial image reconstructed using at least part of the data of the criterial block.

2. The magnetic resonance imaging apparatus according to claim 1,
   wherein the body motion compensation means produces as the plurality of different templates a plurality of images that are different from one another in at least one of a direction in which the criterial image is translated and a distance by which the criterial image is translated.

3. The magnetic resonance imaging apparatus according to claim 1,
   wherein the body motion compensation means produces as the plurality of different templates a plurality of images that are different from one another in at least one of a direction in which the criterial image is rotated and an angle by which the criterial image is rotated.

4. The magnetic resonance imaging apparatus according to claim 2,
   wherein the body motion compensation means detects a translation component of a body motion on the basis of the differences of the reference image from the plurality of templates, and corrects a phase represented by the other block data according to the translation component.

5. The magnetic resonance imaging apparatus according to claim 3,
   wherein the body motion compensation means detects a rotation component of a body motion on the basis of the differences of the reference image from the plurality of templates, and corrects an angle, which the other block data will represent when being remapped to the common k-space by the synthesis means, according to the rotation component.

6. The magnetic resonance imaging apparatus according to claim 1,
wherein the measurement control means measures as a block k-space data within a unit domain that has a predetermined width over a low spatial-frequency domain in the k-space and a high spatial-frequency domain therein and that contains a plurality of parallel measurement trajectories.

7. The magnetic resonance imaging apparatus according to claim 1,
wherein the measurement control means measures as a block k-space data within a unit domain that contains a plurality of radial trajectories which pass through the origin of the k-space.

8. The magnetic resonance imaging apparatus according to claim 1,
wherein the body motion compensation means uses data of a low-frequency portion of a block, which contains the origin of the k-space, to reconstruct the criterial image and reference image.

9. The magnetic resonance imaging apparatus according to claim 1,
wherein the body motion compensation means selects the same block in the same image as the criterial block, and compensates body motions rendered in a plurality of different images.

10. A magnetic resonance imaging method comprising:
(a) a unit measurement step of measuring an echo signal generated from a subject and acquiring block data that contains a measurement trajectory which passes through the origin of the k-space;
(b) a unit measurement repetition step of repeating the unit measurement step by changing the angle of the measurement trajectory relative to one of the coordinate axes of the k-space, and acquiring entire k-space data required for reconstructing an image of the subject;
(c) a criterion selection step of selecting criterial block data, which serves as a criterion, from among a plurality of block data sets;
(d) a step of detecting a body motion of the subject which occurs between acquisition of the criterial block data and acquisition of any other block data;
(e) a body motion compensation step of compensating the body motion represented by the other block data by correcting the other block data according to the detected body motion so as to eliminate the adverse effect of the body motion on an image;
(f) a body motion compensation repetition step of repeating the body motion detection step (d) and the body motion compensation step (e) so as to compensate the body motions represented by all the other block data sets;
(g) a step of remapping the criterial k-space data and the other block data sets having undergone body motion compensation into the common k-space; and
(h) an image reconstruction step of reconstructing an image using the common k-space data,
Wherein: the criterion selection step (c) includes:
a step (i) of reconstructing a criterial image using at least part of the criterial block data; and
a step (j) of producing a plurality of different templates by moving the criterial image; and the body motion compensation step (d) includes:
a step (k) of reconstructing a reference image using at least part of the other block data;
a step (l) of calculating a magnitude of body-motion movement using the plurality of different templates and the reference image; and
a step (m) of compensating the body motion represented by the other block data by correcting the other block data according to the calculated magnitude of body-motion movement.

11. The magnetic resonance imaging method according to claim 10,
wherein: at the criterial image reconstruction step (i), the data of the low-frequency portion of the block is used to reconstruct the criterial image;
the template production step (j) includes:
a step (o) of producing a plurality of rotation templates by rotating the criterial image with at least one of a rotating direction and an angle of rotation differentiated; and
a step (p) of producing a plurality of translation templates by translating the criterial image with at least one of a direction of translation and a distance to be translated differentiated;
the step (l) of calculating a magnitude of body-motion movement includes:
a step (q) of matching the reference image against the plurality of rotation templates, and rotating the reference image in an opposite direction by a magnitude of rotation indicated by the rotation template matched with the reference image;
a step (r) of matching the reference image against the plurality of translation templates, and translating the reference image in an opposite direction by a magnitude of translation indicated by the translation template matched with the reference image; and
a step (s) of repeating the steps (q) and (r) so as to calculate the magnitudes of rotations expressed by reference images with respect to the criterial image and the magnitudes of translations expressed thereby with respect thereto;
the step (m) of compensating the body motion represented by the other block data includes:
a step (t) of correcting the phase represented by the block data according to the magnitude of translation expressed by the reference image; and
at the remapping step (g), angles which the other block data sets having undergone the phase correction will represent when being remapped are corrected based on the magnitude of rotation expressed by the reference image, and the other block data sets are then remapped to the common k-space.

12. The magnetic resonance imaging method according to claim 11,
wherein: at the rotation template production step (o), a plurality of outline rotation templates indicating different angles of rotations in units of an outline rotation detection step, and a plurality of detailed rotation templates indicating different angles of rotations in units of a detailed rotation detection step smaller than the outline rotation detection step are produced;
at the translation template production step (p), a plurality of outline translation templates indicating different magnitudes of translations in units of an outline translation detection step, and a plurality of detailed translation templates indicating different magnitudes of translations in units of a detailed translation detection step smaller than the outline translation detection step are produced;

at the step (q), the outline rotation templates are used;

at the step (r), the outline translation templates are used; and at the repetition step (s), the detailed rotation templates and the detailed translation templates are used.

13. The magnetic resonance imaging method according to claim 10, wherein: at the criterion selection step (c), the same block in the same image is selected as the criterion; and the steps (a) to (m) are repeated in order to successively acquire a plurality of images.

* * * * *